United States Patent [19]
Joseph

[11] Patent Number: 5,986,950
[45] Date of Patent: Nov. 16, 1999

[54] USE OF REDUNDANT CIRCUITS TO IMPROVE THE RELIABILITY OF AN INTEGRATED CIRCUIT

[75] Inventor: Thomas Wesley Joseph, Wappingers Falls, N.Y.

[73] Assignee: International Business Machines Corporation, Armonk, N.Y.

[21] Appl. No.: 08/950,780

[22] Filed: Oct. 15, 1997

[51] Int. Cl.[6] .................................................. G11C 7/00
[52] U.S. Cl. .......................................... 365/200; 365/201
[58] Field of Search ..................................... 365/201, 200

[56] References Cited

U.S. PATENT DOCUMENTS

| | | | |
|---|---|---|---|
| 4,942,556 | 7/1990 | Sasaki et al. | 365/200 |
| 5,153,880 | 10/1992 | Owen et al. | 365/200 |
| 5,199,033 | 3/1993 | McGeoch et al. | 365/200 |
| 5,298,433 | 3/1994 | Furuyama | 365/201 |
| 5,410,510 | 4/1995 | Smith et al. | 365/201 |
| 5,416,740 | 5/1995 | Fujita et al. | 365/200 |
| 5,446,692 | 8/1995 | Haraguchi et al. | 365/200 |
| 5,459,690 | 10/1995 | Rieger et al. | 365/200 |
| 5,471,479 | 11/1995 | McRoberts et al. | 371/10.3 |
| 5,590,075 | 12/1996 | Mazzali | 365/185.22 |

*Primary Examiner*—David Nelms
*Assistant Examiner*—M. Tran
*Attorney, Agent, or Firm*—Ratner & Prestia; H. Daniel Schnurmann

[57] ABSTRACT

To improve both the yield and the reliability of manufactured integrated circuits incorporating redundancy circuits, unused redundancy circuits are additionally used to bracket a defective circuit or circuits identified through production testing by replacing adjacent circuits which have tested satisfactorily and which would otherwise not be replaced, but which are considered to be prone to subsequent failure.

26 Claims, 4 Drawing Sheets

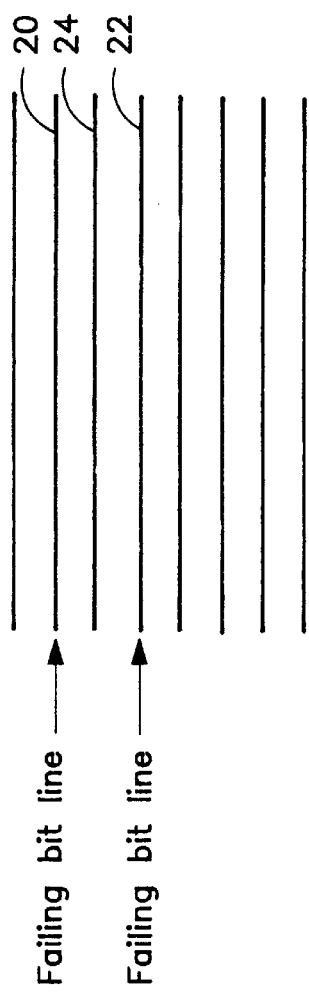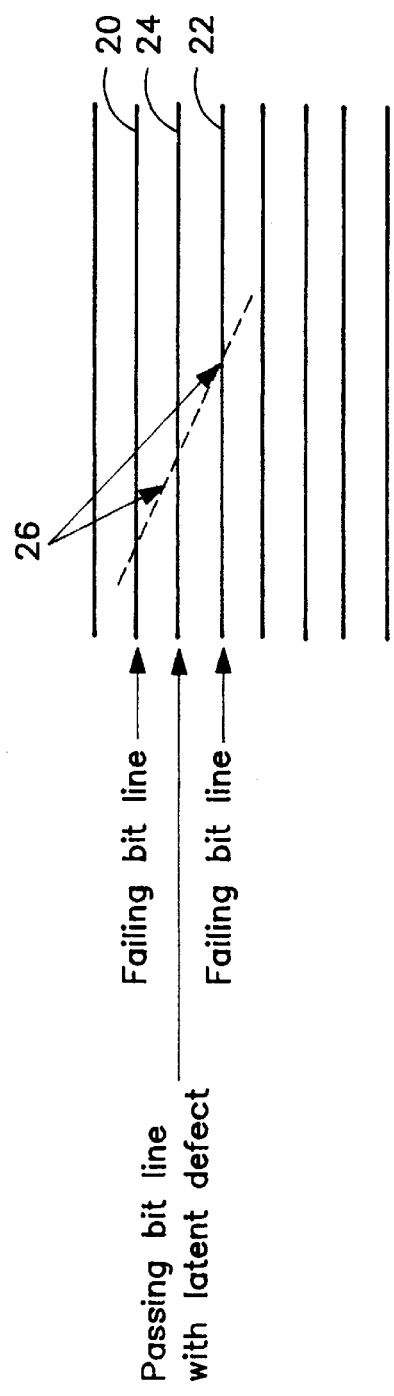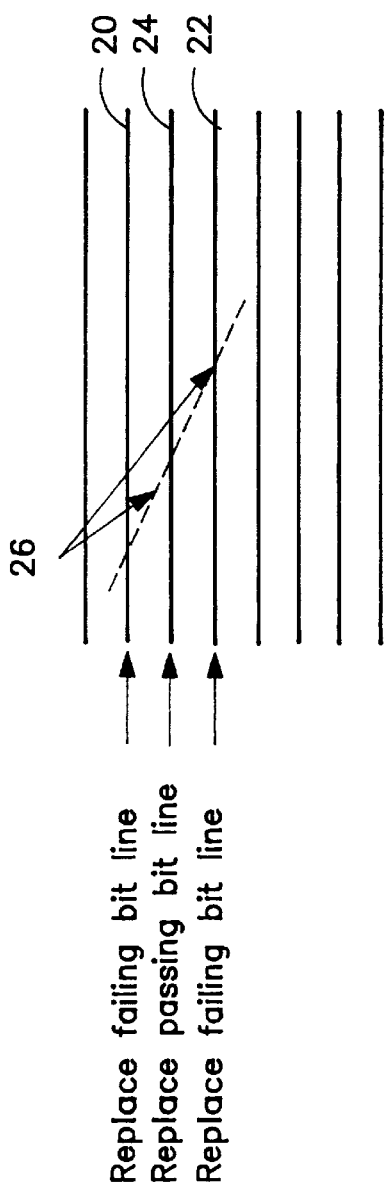

USE OF REDUNDANT CIRCUITS TO IMPROVE THE RELIABILITY OF AN INTEGRATED CIRCUIT

TECHNICAL FIELD

The present invention is generally directed to the manufacture of integrated circuits and, in particular, is directed to the manufacture of semiconductor memory including memory redundancy for purposes of improving the yield of the manufacturing process and the reliability of the manufactured integrated circuit.

BACKGROUND OF THE INVENTION

Defects in integrated circuits resulting from the manufacturing process can compromise both the yield and the reliability of the manufactured circuits. Many reliability defects can be detected by conducting tests at different stages of the manufacturing process. Discard of the defective article, however, then limits the overall yield which can be achieved.

Moreover, some defects cannot be reliably detected at the wafer or module test stages of the manufacturing process or, later, during temperature and voltage burn-in. These undetected defects may subsequently cause a failure of the manufactured integrated circuit either following installation or in the field. As a result, such failures in reliability will most likely be encountered by an end-user or customer.

Yet other problems arise from the extent (size) of a given defect. The larger, more severe manifestations of a defect are more likely to immediately affect a circuit element (or more than one circuit element), making it more likely that the circuit element or a group of circuit elements will fail during production (which can be detected through testing). In the presence of a less severe manifestation of the same type of defect, however, a failure of the circuit element (or group of circuit elements) may not occur until later, following the manufacturing process. This can occur in shipped product, leading to a failure in the field.

In an effort to improve the yield of the manufacturing process, steps have been taken to provide manufactured integrated circuits with "redundancy circuits" which can be used to replace failing portions of the integrated circuit which are detected during the manufacturing process. For example, upon detecting that a memory cell has failed a performance test during a given stage of the manufacturing process, steps can be taken to replace the defective cell with a redundant cell present on the integrated circuit. This allows the integrated circuit to be used, avoiding the need to reject or discard the otherwise operational circuit. Although this measure has been found to improve the yield of the manufacturing process, it has not been found to materially reduce the incidence of subsequent failures of the integrated circuit following its incorporation in a product, or later, in the field.

In recognition of this problem, steps have been taken in an effort to reduce the potential for latent defects resulting from the manufacturing process to cause a subsequent failure of the integrated circuit through the use of redundancy circuits. For example, in U.S. Pat. No. 5,410,510 (Smith et al.), steps are taken to replace memory cells which only marginally pass their reliability testing, deeming them to be defective based upon an assumption that such cells are more likely to fail at a later time. In U.S. Pat. No. 5,471,479 (McRoberts et al.), steps are taken to replace an entire row of memory upon detecting a defective cell in the row. Finally, in U.S. Pat. No. 5,446,692 (Haraguchi et al.), steps are taken to replace two adjacent rows upon the detection of a defective row.

In each case, however, the redundancy circuits are used for the purpose of replacing cells which have in some way been determined to be defective. Although this approach tends to improve reliability, it does not assist in correcting defects which cannot be detected during manufacture of the integrated circuit.

Therefore the primary object of the present invention is to improve the yield and the reliability of integrated circuits incorporating redundancy circuits, particularly including semiconductor memory circuits. Another object of the present invention is to improve the yield and the reliability of integrated circuits incorporating redundancy circuits in a process which is well suited to the manufacture of such circuits.

SUMMARY OF THE INVENTION

These and other objects which will become apparent are achieved in accordance with the present invention by modifying the manner in which redundancy circuits are used to correct detected defects found on an integrated circuit. To this end, when a production test identifies a failing circuit or circuits to be replaced by a redundancy circuit or circuits, unused redundancy circuits are additionally used to bracket the defective circuit or circuits by replacing adjacent circuits which have tested satisfactorily, and which would otherwise not be replaced. In practice it has been found that this approach gives an added margin of safety which can significantly improve both the yield and the reliability of the integrated circuits being manufactured.

As an example, let it be assumed that production testing identifies a failing pair of adjacent bit lines in a semiconductor memory circuit, and that no other failing circuits are detected. In addition to replacing the failing pair of adjacent bit lines with redundancy circuits, and in accordance with the present invention, steps would be taken to replace non-failing bit lines adjacent to the defective bit lines (e.g., on either side of the failing bit lines) with extra redundancy circuits available on the integrated circuit (at the fuse-blow step).

Without wishing to be bound by the following explanation, it is believed that in cases where defective circuits are detected adjacent to circuits which otherwise test satisfactorily, and which would not ordinarily be replaced, the satisfactory circuits adjacent to the defective circuits are significantly more likely to contain latent defects prone to subsequent failure. By replacing such circuits, the potential for subsequent failure in the field is significantly reduced.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 2 through 5 are schematic illustrations showing application of the improvements of the present invention to a series of bit lines associated with a semiconductor memory circuit.

DETAILED DESCRIPTION OF PREFERRED EMBODIMENTS

The present invention is generally directed to the manufacture of integrated circuits, including both the operative circuits which they were designed to carry and so-called "redundancy circuits" for use in replacing defective portions of the operative circuits which are detected by testing during the manufacturing process. The following discussion will be presented in the context of semiconductor memory circuits. It will be understood, however, that the improvements of the present invention will find equal utility in conjunction with other types of integrated circuits of a similar overall architecture.

Previously, in the course of manufacturing an integrated circuit, steps were taken to test the performance of the circuit at various stages of the manufacturing process. Upon the detection of a defective region (e.g., a defective memory cell), steps were taken to replace the defective region with a redundant or spare circuit (cell) located either within the main array (on the same integrated circuit) or in a separate array (on the same or on a different integrated circuit) present on the fabricated integrated circuit, usually by programming fuses provided on the chip. The regions of the integrated circuit which surrounded the defective region, and which tested satisfactorily, were left unmodified.

In accordance with the present invention, it has been determined that the regions of the integrated circuit which surround a defective region are significantly more likely to subsequently fail, even though such regions had tested satisfactorily during the manufacturing process. Such regions are replaced with redundancy circuits which remain available on the integrated circuit (i.e., following testing of the integrated circuit and the replacement of any other defective regions found on the integrated circuit with redundancy circuits). In this way, the likelihood that a latent defect will cause a subsequent failure of the integrated circuit in the field (following assembly) is significantly reduced.

The satisfactory regions which are adjacent to the defective region, yet which are to be replaced in accordance with the present invention, are identified by analyzing patterns in the defective region (e.g., a failing cell) and by identifying satisfactory regions (i.e., good cells) which are adjacent to the defective region and which are considered more likely to fail as a result of some latent defect. Any of a variety of models, patterns, and methods may be followed in making such determinations.

Figure 1:
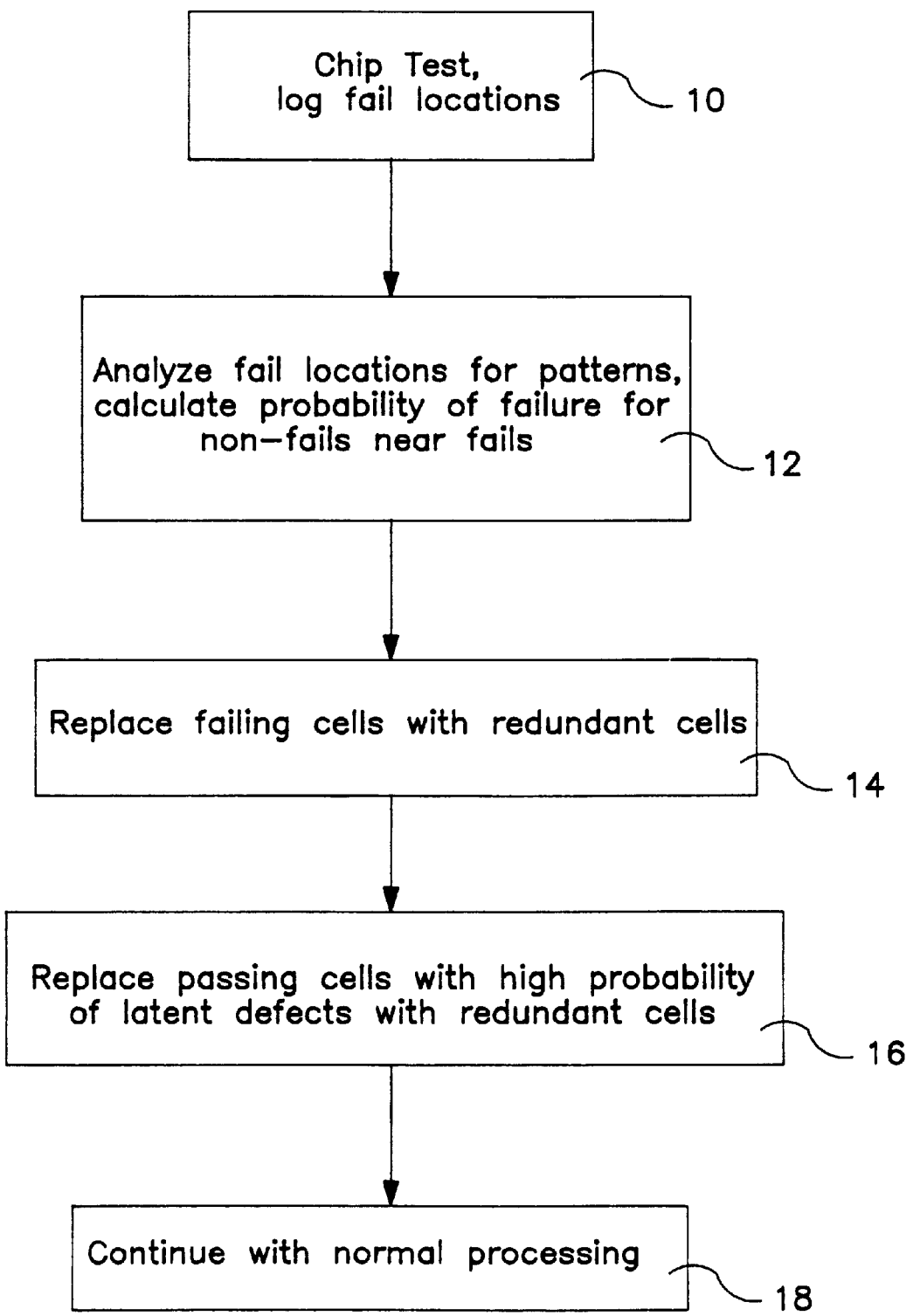
FIG. 1 is a flow chart illustrating a method for implementing the improvements of the present invention.

FIG. 1 generally illustrates a preferred method for implementing the improvements of the present invention. The flow chart of FIG. 1 is directed to a method for replacing cells or groups of cells in a semiconductor memory array based on the probability that such cells are prone to failure in the future. As a first step 10, a standard chip test is performed. The test can be any of a variety of known tests conventionally used in the industry for purposes of logging the locations of failing cells, bit lines, word lines, and the like.

Detected and logged failures are then mapped or analyzed for any patterns, at step 12. This step can include any of a variety of determinations for purposes of identifying any of a number of patterns, examples of this including clusters of cells and adjacent or clustered bit lines or word lines. These determinations are preferably made and compared against certain predetermined (empirically established) patterns defined responsive to the prior analysis of similar integrated circuits, and their failure, and the probability that a non-detectable or latent defect may exist near or adjacent to a detected failure (defective region).

For example, FIG. 2 schematically illustrates two bit lines 20, 22 of an integrated circuit which have been determined to have failed (e.g., at the wafer test stage). The failed bit lines 20, 22 have one non-failing bit line 24 located between them. In accordance with the present invention, however, and based on a prior analysis of similar failures (at the analysis step 12 of FIG. 1), let it be assumed that the determination has previously been made that there is a significant probability that a scratch 26 traversing all three of the bit lines 20, 22, 24 may be responsible for the detected failure of the bit lines 20, 22, as shown in FIG. 3. In such a case, the possibility exists that the scratch 26 was not sufficiently pronounced to cause an electrical defect on the center bit line 24, with the result that this latent defect would not be detected through electrical testing of the integrated circuit.

Previously, steps would have been taken to replace only the failing bit lines 20, 22 with redundant bit lines. The scratch 26 may nevertheless cause or contribute to a later failure of the non-failing bit line 24, which during testing was in a latent state. Further processing of the integrated circuit (e.g., packaging), or system use conditions, may cause the bit line 24 to later fail.

Figure 5:
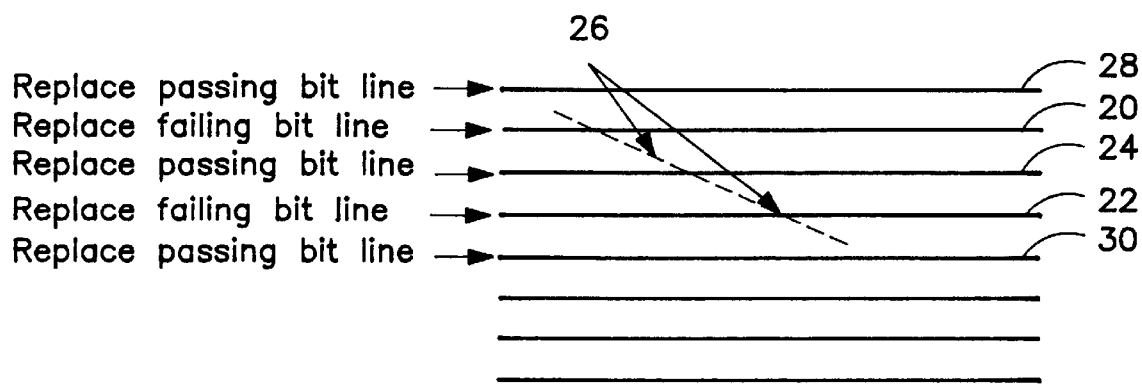

In accordance with the present invention and in order to maximize reliability, the two failing bit lines 20, 22, as well as the intervening non-failing bit line 24, are all replaced with spare (redundant) bit lines, as shown in FIG. 4. In some cases, as shown in FIG. 5, it may further be desirable to replace additional non-failing bit lines 28, 30 adjacent to the bit lines 20, 22 to bracket the replaced grouping of bit lines 20, 22, 24. Such replacement further isolates the potentially latent defect presented by the scratch 26, which could cause a subsequent failure of the bit lines 24, 28, 30.

Figure 6:
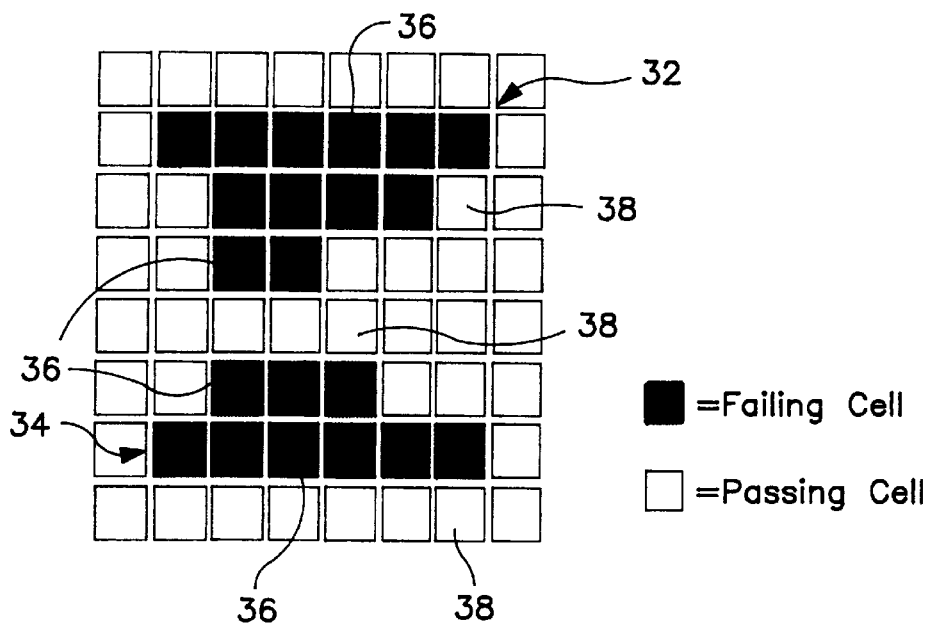
FIGS. 6 and 7 are schematic illustrations showing application of the improvements of the present invention to clusters of failing cells associated with a semiconductor memory circuit.

As a further example, FIG. 6 shows clustered or loose groupings 32, 34 of failing cells which have been detected as a result of the test step 10 of FIG. 1. Previously, spare cells from the redundant array would have been used to replace the failing cells 36 found in the clusters 32, 34 and the remaining, non-failing cells 38 would have been left in service because they were not determined to have failed.

Figure 7:
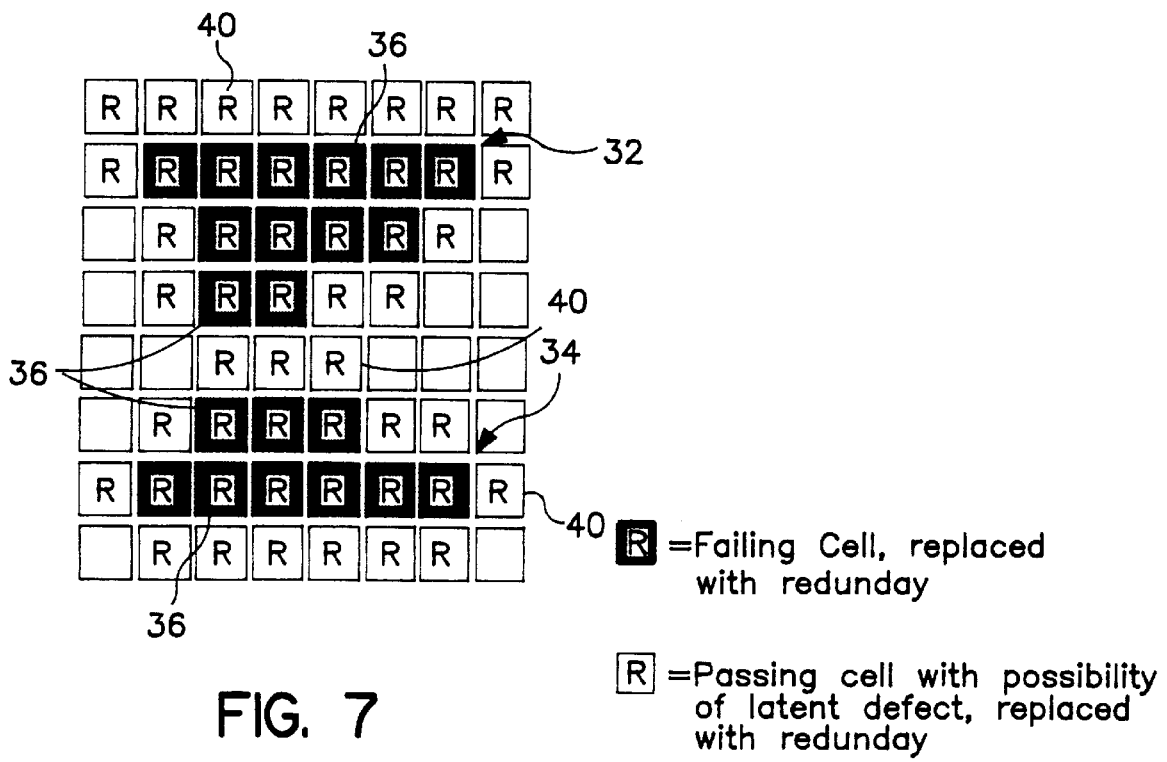

In accordance with the present invention, however, and based on a prior analysis of similar failures (at the analysis step 12 of FIG. 1), let it be assumed that the determination has previously been made that there is a significant probability that the non-failing cells 38 may in the future be affected by the same defect as that which caused the detected failure of the cells 36 in the clusters 32, 34 (e.g., as a result of contact resistance, charge contamination, and the like), but which had not yet progressed to a level that could be detected by the electrical test being used. In such a case, the non-failing (passing) cells 38 may degenerate to the point of failing at a later time, following assembly or in use. In accordance with the present invention and in order to maximize reliability, the cells 36 of the failed clusters 32, 34, in addition to the passing cells 40 surrounding the failed clusters 32, 34, are all replaced with spare (redundant) cells, as shown in FIG. 7.

Added assurances may be provided by replacing plural cells surrounding a failed region (e.g., two or more cells on all sides of any failing cells, or groupings of cells), to the extent that redundant cells are available for such purposes. For example, plural (two or more) rings of redundant cells 40 could be used to surround the failed clusters 32, 34, if desired, to further isolate the potentially latent defects presented by the failed clusters 32, 34.

For purposes of implementing the improvements of the present invention, redundant cells available on the integrated circuit are used to replace cells which are otherwise in an operational condition. For this reason, any such use of the redundant cells is preferably limited to those redundant cells which remain available for use following all testing and the replacement of any defective cells which may be in need of replacement to ensure that the integrated circuit is fully operational.

Referring again to FIG. 1, and in order to ensure that a sufficient number of redundant cells remain available to replace the defective cells identified by the test 10, steps are preferably taken to first replace the cells with detected defects (failed cells), at step 14. Following this, otherwise operative cells identified as possibly having latent defects (potential failures) are replaced, at step 16. This serves to maintain the benefits in yield that are offered in accordance with the present invention while ensuring that sufficient spare cells are available for use in repairing those areas where actual defects have been identified.

It is possible that, in some cases, the number of redundant cells remaining for use following the replacement of any defective cells will be insufficient to replace all of the non-failing cells identified in accordance with the present invention. In such cases, it would be possible to selectively replace only some of the non-failing cells with the remaining redundant cells, based upon some appropriate criteria. For example, those potentially latent defects which are considered to be more likely to lead to a subsequent failure may be repaired first, on a priority basis, leaving other occurrences less likely to cause a subsequent failure without replacement.

Following the allocation of redundant cells as previously described, to replace failing cells and to replace non-failing cells having a high probability of failure, further processing of the integrated circuit can continue as normal, at step 18, including subsequent steps such as wafer dicing and packaging, among other steps.

It will be understood that various changes in the details, materials, and arrangement of parts which have been described and illustrated in order to explain the nature of the present invention may be made by those skilled in the art within the principle and scope of the invention as expressed in the following claims. For example, as an alternative, the physical locations of any failing circuits found on an integrated circuit having redundancy circuits could be mapped or otherwise analyzed for patterns. Because neighboring circuits may be present in different networks, patterns of failures may not be obvious until such an analysis is performed. Once the patterns are identified, desired passing (non-failing) circuits adjacent to or nearby the failing circuits can be replaced based on the probability of a latent defect being present.

What is claimed:

1. A method for improving yield and reliability in a manufactured integrated circuit incorporating redundant circuits, comprising the steps of:

testing the integrated circuit for defects to identify defective portions of the integrated circuit, wherein the defective portions define a pattern;

analyzing the pattern of the defective portions of the integrated circuit by comparing the pattern of the defective portions with a predetermined pattern of an integrated circuit including a latent defect for causing a subsequent failure of the integrated circuit, and identifying non-defective portions of the integrated circuit corresponding to the predetermined pattern of the integrated circuit including the latent defect;

replacing the defective portions of the integrated circuit with the redundant circuits; and replacing the non-defective portions of the integrated circuit corresponding to the predetermined pattern with additional redundant circuits.

2. The method of claim 1 wherein the non-defective portions of the integrated circuit corresponding to the predetermined pattern are replaced with the additional redundant circuits after the defective portions of the integrated circuit are replaced with the redundant circuits.

3. The method of claim 1 wherein the testing further includes identifying portions of the predetermined pattern which correspond to the defective portions of the integrated circuit and identifying portions of the predetermined pattern which correspond to the non-defective portions of the integrated circuit.

4. The method of claim 3 which further includes the step of replacing the portions of the predetermined pattern which correspond to the non-defective portions of the integrated circuit with the additional redundant circuits.

5. The method of claim 1 wherein the non-defective portions of the integrated circuit which correspond to the predetermined pattern are replaced with the additional redundant circuits which remain available after replacing the defective portions of the integrated circuit with the redundant circuits.

6. The method of claim 5 wherein sufficient redundant circuits are available for replacing the non-defective portions of the integrated circuit, and wherein all of the non-defective portions of the integrated circuit are replaced with the additional redundant circuits.

7. The method of claim 5 wherein insufficient redundant circuits are available for replacing the non-defective portions of the integrated circuit, and wherein only some of the non-defective portions of the integrated circuit are replaced with the additional redundant circuits.

8. The method of claim 1 wherein the integrated circuit is a semiconductor memory circuit including a plurality of memory cells, and wherein the testing includes testing of the memory cells.

9. The method of claim 8 wherein the defective memory cells are associated with a defective bit line, and which further includes the step of replacing a non-defective bit line adjacent to the defective bit line.

10. The method of claim 9 wherein the defective memory cells are associated with first and second defective bit lines separated by a non-defective bit line, and which further includes the step of replacing the non-defective bit line located between the first and second defective bit lines.

11. The method of claim 9 which further includes the step of replacing a plurality of non-defective bit lines surrounding the defective bit line.

12. The method of claim 8 wherein the defective memory cells are associated with a defective word line, and which further includes the step of replacing a non-defective word line adjacent to the defective word line.

13. The method of claim 8 wherein the defective memory cells are located in a cluster, and which further includes the step of replacing non-defective memory cells surrounding the cluster.

14. The method of claim 13 wherein all of the non-defective memory cells surrounding the cluster are replaced, forming a ring of replaced, non-defective memory cells surrounding the cluster.

15. The method of claim 14 which further includes the step of replacing a plurality of rings of the non-defective memory cells surrounding the cluster.

16. A manufactured integrated circuit of improved yield and reliability which comprises an operative circuit including non-defective portions, and redundant circuits for replacing defective portions of the operative circuit, wherein the defective portions of the integrated circuit correspond to a predetermined pattern of an integrated circuit including a latent defect for causing a subsequent failure of the integrated circuit, wherein the predetermined pattern includes portions which correspond to the non-defective portions of the integrated circuit, and wherein the non-defective portions of the integrated circuit corresponding to the predetermined pattern are replaced with additional redundant circuits.

17. The manufactured integrated circuit of claim 16 wherein all of the non-defective portions of the integrated circuit corresponding to the predetermined pattern are replaced with the additional redundant circuits.

18. The manufactured integrated circuit of claim 16 wherein only some of the non-defective portions of the integrated circuit corresponding to the predetermined pattern are replaced with the additional redundant circuits.

19. The manufactured integrated circuit of claim 16 wherein the integrated circuit is a semiconductor memory circuit including a plurality of memory cells.

20. The manufactured integrated circuit of claim 19 wherein defective memory cells are associated with a defective bit line, and wherein the defective bit line and a non-defective bit line adjacent to the defective bit line are replaced with the additional redundant circuits.

21. The manufactured integrated circuit of claim 20 wherein the defective memory cells are associated with first and second defective bit lines separated by a non-defective bit line, and wherein the non-defective bit line located between the first and second defective bit lines is replaced.

22. The manufactured integrated circuit of claim 20 wherein a plurality of non-defective bit lines surrounding the defective bit line are replaced.

23. The manufactured integrated circuit of claim 19 wherein defective memory cells are associated with a defective word line, and wherein the defective word line and a non-defective word line adjacent to the defective word line are replaced with the additional redundant circuits.

24. The manufactured integrated circuit of claim 19 wherein defective memory cells are located in a cluster, and wherein non-defective memory cells surrounding the cluster are replaced.

25. The manufactured integrated circuit of claim 24 wherein all of the non-defective memory cells surrounding the cluster are replaced, forming a ring of replaced, non-defective memory cells surrounding the cluster.

26. The manufactured integrated circuit of claim 25 wherein a plurality of rings of the non-defective memory cells surrounding the cluster are replaced.

* * * * *